United States Patent
Xu et al.

(10) Patent No.: US 11,131,919 B2
(45) Date of Patent: Sep. 28, 2021

(54) EXTREME ULTRAVIOLET (EUV) MASK STACK PROCESSING

(71) Applicant: INTERNATIONAL BUSINESS MACHINES CORPORATION, Armonk, NY (US)

(72) Inventors: Yongan Xu, Niskayuna, NY (US); Zhenxing Bi, Niskayuna, NY (US); Yann Mignot, Slingerlands, NY (US); Nelson Felix, Slingerlands, NY (US); Ekmini A. De Silva, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 215 days.

(21) Appl. No.: 16/015,994

(22) Filed: Jun. 22, 2018

(65) Prior Publication Data
US 2019/0391481 A1    Dec. 26, 2019

(51) Int. Cl.
*G03F 7/11*    (2006.01)
*G03F 7/42*    (2006.01)
*G03F 7/20*    (2006.01)
*G03F 7/36*    (2006.01)
(Continued)

(52) U.S. Cl.
CPC ............... *G03F 1/22* (2013.01); *G03F 7/094* (2013.01); *G03F 7/11* (2013.01); *G03F 7/2004* (2013.01); *G03F 7/36* (2013.01); *G03F 7/42* (2013.01)

(58) Field of Classification Search
CPC ...... G03F 7/2004; G03F 7/0752; G03F 7/094; G03F 7/42; G03F 1/48; G03F 1/80; G03F 1/22; G03F 7/11; G03F 7/36; G03F 7/09; G03F 7/20; G03F 7/2022; G03F 7/2037
See application file for complete search history.

(56) References Cited

U.S. PATENT DOCUMENTS

| | | | | |
|---|---|---|---|---|
| 4,343,677 A | * | 8/1982 | Kinsbron | C23F 4/00 438/704 |
| 4,589,952 A | * | 5/1986 | Behringer | G03F 1/20 216/12 |

(Continued)

FOREIGN PATENT DOCUMENTS

| | | | |
|---|---|---|---|
| JP | 56-017041 | * | 2/1981 |
| JP | 57-106052 | * | 7/1982 |

(Continued)

OTHER PUBLICATIONS

Machine translation of jp 61-171151 (1986 ).*

(Continued)

*Primary Examiner* — Martin J Angebranndt
(74) *Attorney, Agent, or Firm* — Tutunjian & Bitetto, P.C.; Abdy Raissinia

(57) ABSTRACT

A method of removing layers of an extreme ultraviolet (EUV) pattern stack is provided. The method includes forming one or more resist templates on an upper hardmask layer. The method further includes exposing portions of the surface of the upper hardmask layer to a dry etch process to produce modified and activated surfaces. The method further includes etching the modified and activated surfaces to expose an underlying organic planarization layer.

15 Claims, 6 Drawing Sheets

(51) Int. Cl.
*G03F 7/09* (2006.01)
*G03F 1/22* (2012.01)

(56) References Cited

U.S. PATENT DOCUMENTS

| | | | | |
|---|---|---|---|---|
| 5,001,083 | A * | 3/1991 | D'Anna | G03F 7/11 |
| | | | | 438/694 |
| 5,403,435 | A * | 4/1995 | Cathey | H01L 21/0274 |
| | | | | 216/17 |
| 5,747,852 | A * | 5/1998 | Chang | H01L 29/6659 |
| | | | | 257/336 |
| 5,942,446 | A * | 8/1999 | Chen | H01L 21/31116 |
| | | | | 216/67 |
| 6,372,634 | B1 * | 4/2002 | Qiao | H01L 21/31116 |
| | | | | 257/E21.252 |
| 6,630,288 | B2 * | 10/2003 | Shields | H01L 21/28123 |
| | | | | 257/E21.206 |
| 8,241,511 | B2 * | 8/2012 | Kushibiki | H01L 21/31116 |
| | | | | 216/46 |
| 9,373,522 | B1 | 6/2016 | Wang et al. | |
| 9,437,451 | B2 | 9/2016 | Chen et al. | |
| 9,472,417 | B2 | 10/2016 | Ingle et al. | |
| 9,818,610 | B2 | 11/2017 | Matsumoto et al. | |
| 9,997,371 | B1 * | 6/2018 | Agarwal | G03F 7/40 |
| 10,388,732 | B1 * | 8/2019 | Frougier | H01L 29/66439 |
| 2004/0018738 | A1 * | 1/2004 | Liu | H01L 21/28114 |
| | | | | 438/700 |
| 2004/0018739 | A1 * | 1/2004 | Abooameri | H01L 21/32137 |
| | | | | 438/709 |
| 2004/0029021 | A1 * | 2/2004 | Garza | G03F 1/29 |
| | | | | 430/5 |
| 2004/0203177 | A1 * | 10/2004 | Davis | H01J 37/32935 |
| | | | | 438/14 |
| 2004/0224520 | A1 * | 11/2004 | Yun | H01L 21/76829 |
| | | | | 438/691 |
| 2006/0194435 | A1 * | 8/2006 | Nishimura | H01L 21/02063 |
| | | | | 438/689 |
| 2010/0266965 | A1 * | 10/2010 | Schmid | B82Y 10/00 |
| | | | | 430/323 |
| 2011/0165778 | A1 * | 7/2011 | Choi | G03F 1/78 |
| | | | | 438/694 |
| 2011/0170225 | A1 * | 7/2011 | Rogers | G03G 15/323 |
| | | | | 361/225 |
| 2012/0045900 | A1 * | 2/2012 | Watanabe | G03F 7/11 |
| | | | | 438/703 |
| 2012/0329272 | A1 * | 12/2012 | Arnold | H01L 21/0337 |
| | | | | 438/653 |
| 2013/0341304 | A1 * | 12/2013 | Minegishi | G03F 7/09 |
| | | | | 216/47 |
| 2014/0162457 | A1 * | 6/2014 | Sipani | H01L 21/76816 |
| | | | | 438/696 |
| 2016/0016791 | A1 * | 1/2016 | Jacobs | B81C 1/00595 |
| | | | | 257/437 |
| 2016/0229884 | A1 * | 8/2016 | Indermuhle | C12Q 1/6834 |
| 2016/0365248 | A1 * | 12/2016 | Mebarki | H01L 21/02274 |
| 2017/0011931 | A1 | 1/2017 | Park et al. | |
| 2017/0271151 | A1 * | 9/2017 | Yaguchi | H01L 21/31144 |
| 2018/0040505 | A1 * | 2/2018 | Gaan | H01L 21/76283 |
| 2018/0166438 | A1 * | 6/2018 | Linewih | H01L 29/66659 |
| 2018/0173109 | A1 * | 6/2018 | Gronheid | G03F 7/0002 |
| 2018/0203355 | A1 * | 7/2018 | De Silva | H01L 21/0332 |
| 2018/0204723 | A1 * | 7/2018 | Chen | G03F 7/11 |
| 2019/0146336 | A1 * | 5/2019 | Chen | G03F 7/70691 |
| | | | | 216/13 |
| 2019/0206681 | A1 * | 7/2019 | De Silva | H01L 21/0335 |
| 2019/0384180 | A1 * | 12/2019 | Briggs | H01L 21/76816 |
| 2020/0098581 | A1 * | 3/2020 | Xu | G03F 1/22 |
| 2020/0124972 | A1 * | 4/2020 | Meli Thompson | G03F 7/094 |

FOREIGN PATENT DOCUMENTS

| | | | |
|---|---|---|---|
| JP | 61-171151 | * | 8/1986 |
| JP | 01-015935 | * | 1/1989 |
| JP | 04-015925 | * | 1/1992 |
| JP | 04-274321 | * | 9/1992 |
| JP | 2006-253634 | * | 9/2006 |
| JP | 2011-146535 | * | 7/2011 |

OTHER PUBLICATIONS

Machine translation of jp 04-274321 (1992 ).*
Machine transaltion of JP 57-106052 (1982).*
Machine translation of JP 01-015935 (1989).*
Machine translation of JP 2006-253634 (2006).*
Machine translation of JP 2011-146535 (2011).*
Machine translation of JP 56-017041 (1981).*
Machine translation of JP 04-015925 (1992).*

* cited by examiner

EXTREME ULTRAVIOLET (EUV) MASK STACK PROCESSING

BACKGROUND

Technical Field

The present invention generally relates to extreme ultraviolet masks, and more particularly to methods of processing extreme ultraviolet masks.

Description of the Related Art

The image of the extreme ultraviolet (EUV) mask features are intended to be transferred to a photoresist on a substrate. In the past photoresists have been positive resists in which the exposed area is made soluble in the developer or negative resists in which the exposed area is made insoluble to the developer, however, the physical characteristics of the EUV light has altered the types and arrangements of materials that can be used to form the photoresist.

SUMMARY

In accordance with an embodiment of the present invention, a method of removing layers of an extreme ultraviolet (EUV) pattern stack is provided. The method includes forming one or more resist templates on an upper hardmask layer. The method further includes exposing portions of the surface of the upper hardmask layer to a dry etch process to produce modified and activated surfaces. The method further includes etching the modified and activated surfaces to expose an underlying organic planarization layer.

In accordance with another embodiment of the present invention, a method of removing layers of an extreme ultraviolet (EUV) pattern stack is provided. The method includes forming one or more resist templates on an adhesion layer. The method further includes removing exposed portions of the adhesion layer to expose an upper hardmask layer. The method further includes exposing portions of the surface of the upper hardmask layer to a dry etch process to produce modified and activated surfaces, and etching the modified and activated surfaces to expose an underlying organic planarization layer.

In accordance with yet another embodiment of the present invention, an extreme ultra violet (EUV) patterning stack is provided. The EUV patterning stack includes an organic planarization layer on a substrate. The EUV patterning stack further includes an upper hardmask layer on the organic planarization layer, and one or more resist templates on the upper hardmask layer, wherein the each of the one or more resist templates have a thickness less than 20 nm.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a multi-layer EUV patterning stack and method of doing lithography hardmask opening by using a gas phase hardmask etch without photo resist patterning loss on the EUV patterning stack. Photo resist patterning loss can include breaks in the resist templates formed on a hardmask, where the breaks can result in shorts or open circuits further in a device fabrication process.

A dry chemical etch method for an etch that is highly selective to photo resist material, and effective with high aspect ratio features without undercutting adjacent patterning stack layers is also provided.

Exemplary applications/uses to which the present invention can be applied include, but are not limited to: memory devices (e.g., static random access memory (SRAM), dynamic random access memory (DRAM), and logic devices (e.g., NAND gates, NOR gates, XOR gates, flip-flops, etc.).

It is to be understood that aspects of the present invention will be described in terms of a given illustrative architecture; however, other architectures, structures, substrate materials and process features and steps can be varied within the scope of aspects of the present invention.

Figure 1:
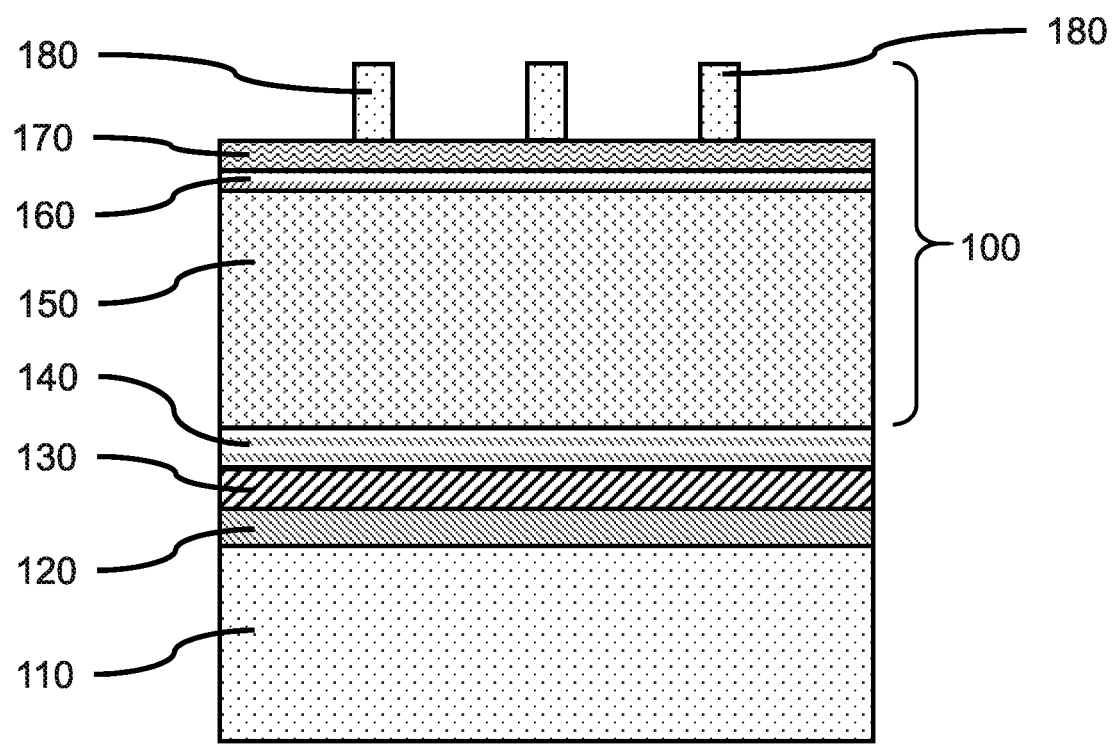
FIG. 1 is a cross-sectional view showing an extreme ultra violet (EUV) quad-layer patterning stack on a substrate, in accordance with an embodiment of the present invention.

Referring now to the drawings in which like numerals represent the same or similar elements and initially to FIG. 1, an extreme ultra violet (EUV) quad-layer patterning stack on a substrate is shown, in accordance with an embodiment of the present invention.

An EUV patterning stack 100 can have three layers (tri-layer) or four layers (quad-layer). The extreme ultra violet (EUV) quad-layer patterning stack 100 can include an organic planarization layer (OPL) 150 on a substrate 110, an upper hardmask layer 160 on the OPL 150, an adhesion layer 170 on the upper hardmask layer 160, and a resist layer on the adhesion layer 170. The resist layer can be patterned and developed to form one or more resist templates 180 on the adhesion layer 170.

In one or more embodiments, the resist layer can be formed on the adhesion layer 170, where the resist layer can be a photoresist that can be sensitive to UV light, EUV light, and/or an electron beam, for example, an organic photoresist (e.g., poly (methyl methacrylate) (PMMA)), a photo-sensitive chemically amplified resist (e.g., poly(tert-butoxycarboxystyrene) (PBOCSt)), or an inorganic non-CAR negative tone resist (e.g., spin-coating solvent and organic ligand-refractory metal oxide nanoparticle). The resist layer can be formed by LPCVD or spun-on. In various embodiments, the resist layer can include photo acid generators (PAGs) to increase sensitivity to the EUV light. The resist layer can be a negative resist or a positive resist. The resist layer can be patterned using an EUV imaging system.

In one or more embodiments, the spin-on resist layer can have a thickness in the range of about 10 nm to about 40 nm, where the resist layer can be patterned to form the resist templates 180. After lithography and development, the resist templates 180 can have a thickness in a range of about 5 nm to about 30 nm, or about 5 nm to about 20 nm, or about 5 nm to about 18 nm, or about 14 nm to about 18 nm. In various embodiments, the resist templates 180 can have a thickness of less than 20 nm, or less than about 18 nm, where the resist templates thickness is less than the thickness that would be used with a plasma based dry etching process (e.g., reactive ion etching (RIE)).

In various embodiments, the adhesion layer 170 can be formed below the resist layer and resist templates 180, where the adhesion layer 170 can increase the adhesion of the resist layer and resist templates 180 to an underlying upper hardmask layer 160 to reduce pattern collapse and form a barrier to diffusion of acidic and basic molecules and moieties, including, for example, sulfonium and iodonium based acid molecules, in the resist layer. The adhesion layer 170 can be a fast etching material to allow transfer of a resist pattern from the resist templates 180 to a hardmask layer without resulting resist erosion and/or feature broadening.

In various embodiments, the adhesion layer 170 can increase the adhesion of the resist layer to >0 for a resist material that would otherwise have an adhesion of 0 directly to a metal hardmask (i.e., would spontaneously delaminate).

In one or more embodiments, the adhesion layer 170 can be the same material as the organic planarization layer. In various embodiments, the adhesion layer 170 may contain photo acid generator (PAG) to minimize or eliminate the resist scumming, while providing a strong adhesion promotor function.

In various embodiments, the adhesion layer 170 can have a thickness in the range of about 2 nm to about 15 nm, or in the range of about 3 nm to about 10 nm. The adhesion layer 170 can be one or two monolayers of hexamethyldisilazane (HMDS), where the HMDS promotes adhesion, but allows tighter pitches for the resist templates 180. In various embodiments, the dense pitch between adjacent resist templates can be about 28 nm, or in a range of about 22 nm to about 1000 nm, or in a range of about 22 nm to about 100 nm.

In one or more embodiments, an upper hardmask layer 160 can be below the adhesion layer 170, where the upper hardmask layer 160 can be an inorganic material layer, for example, amorphous silicon (a-Si), a spin-on SiCHO-type silicon anti-reflection coating (SiARC), a silicon oxide (SiO) layer (e.g., silicon dioxide ($SiO_2$)), silicon oxycarbide (SiOC)), a silicon nitride (SiN) layer (e.g., silicon nitride ($Si_3N_4$)), a silicon carbide layer (SiC), an amorphous silicon (a-Si)/silicon nitride (SiN) bilayer, or a combination thereof.

In one or more embodiments, an organic planarization layer 150 can be formed on the substrate 110. The organic planarization layer 150 can be a flowable oxide, a spin-on-carbon (SOC), a low-k dielectric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof. In various embodiments, the OPL 150 can be formed by CVD, LPCVD, or spun on.

In one or more embodiments, the organic planarization layer 150 can have a thickness in the range of about 20 nm to about 200 nm, or in the range of about 30 nm to about 150 nm, or in the range of about 30 nm to about 75 nm, where the OPL 150 can provide a flat, uniform surface for formation of the upper hardmask layer 160.

In one or more embodiments, a pattern stack 100 is formed on an underlying substrate 110, which may have previously formed device features on or in a semiconductor portion of a substrate. The substrate 110 can include an interlayer dielectric layer on the semiconductor portion of the substrate and the previously formed device features. The device features can include a plurality of fabricated and/or partially fabricated semiconductor devices that can subsequently form a completed device. The device features can include, but are not limited to, sources, drains, channels, gates, fins, contacts, as well as, other conductive (e.g., lines, vias), resistive (e.g., resistors), insulating (e.g., shallow trench isolation regions, buried oxide layers), and semiconductor layers and components (e.g., capacitive and inductive components).

In one or more embodiments, a substrate 110 can include a semiconductor or an insulator with an active surface semiconductor layer. The substrate 110 can include a carrier layer that provides structural support to other thinner layers. The substrate 110 can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides.

In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In various embodiments, front-end-of-line processes, including, but not limited to, masking, developing, etching, depositing, and epitaxial growth, may already have been performed on the substrate 110 to fabricate partial devices, such as transistors (e.g., FinFETs, MOSFETS, etc.) for logic and memory devices prior to subsequent lithographic steps using EUV light and a pattern stack 100.

In various embodiments, a sacrificial layer 120 can be formed on the substrate 110, where the sacrificial layer can be a silicon nitride (SiN) layer that is used for an etch-stop layer, and used as a capping layer for underlying layers.

After a final etch and metallization process, the sacrificial layer 120 can be removed using a selective etch.

In various embodiments, the sacrificial layer 120 can be a dielectric material, including, but not limited to silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), and combinations thereof. In various embodiments, the sacrificial layer 120 can be silicon nitride ($Si_3N_4$).

In various embodiments, the sacrificial layer 120 can have a thickness in a range of about 5 nm to about 50 nm, or about 10 nm to about 30 nm.

In one or more embodiments, a hardmask layer 130 can be formed on the sacrificial layer 120, where the hardmask layer 130 can be formed by a deposition process, for example, atomic layer deposition (ALD), plasma enhanced ALD (PEALD), chemical vapor deposition (CVD), low pressure CVD (LPCVD), plasma enhanced CVD (PECVD), physical vapor deposition (PVD), and combinations thereof. The hardmask can be used to mask the underlying layers for forming device features through etching (e.g., reactive ion etching (RIE), dry plasma etching, wet chemical etching, etc.).

In various embodiments, the hardmask layer 130 can have a thickness in a range of about 5 nm to about 50 nm, or about 15 nm to about 30 nm.

In various embodiments, the hardmask layer 130 can be a refractory metal nitride layer, for example, titanium nitride (TiN), hafnium nitride (HfN), or zirconium nitride (ZrN). In various embodiments, the hardmask layer 130 is titanium nitride (TiN). In various embodiments, the hardmask layer 130 is not silicon nitride (SiN).

In one or more embodiments, a liner layer 140 can be formed on the hardmask layer 130. The liner layer can be a fluoride-doped silicon oxide (e.g., fluoride doped glass), a carbon doped silicon oxide (SiO:C), a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof. In various embodiments, the liner layer 140 can be formed by CVD, LPCVD, or spun on. The liner layer 140 can protect the underlying layers, including the hardmask layer 130, during processing/rework, and for the memorization of the resist template pattern and overlying layers.

In various embodiments, the organic planarization layer (OPL) 150 is formed on the liner layer 140.

Figure 2:
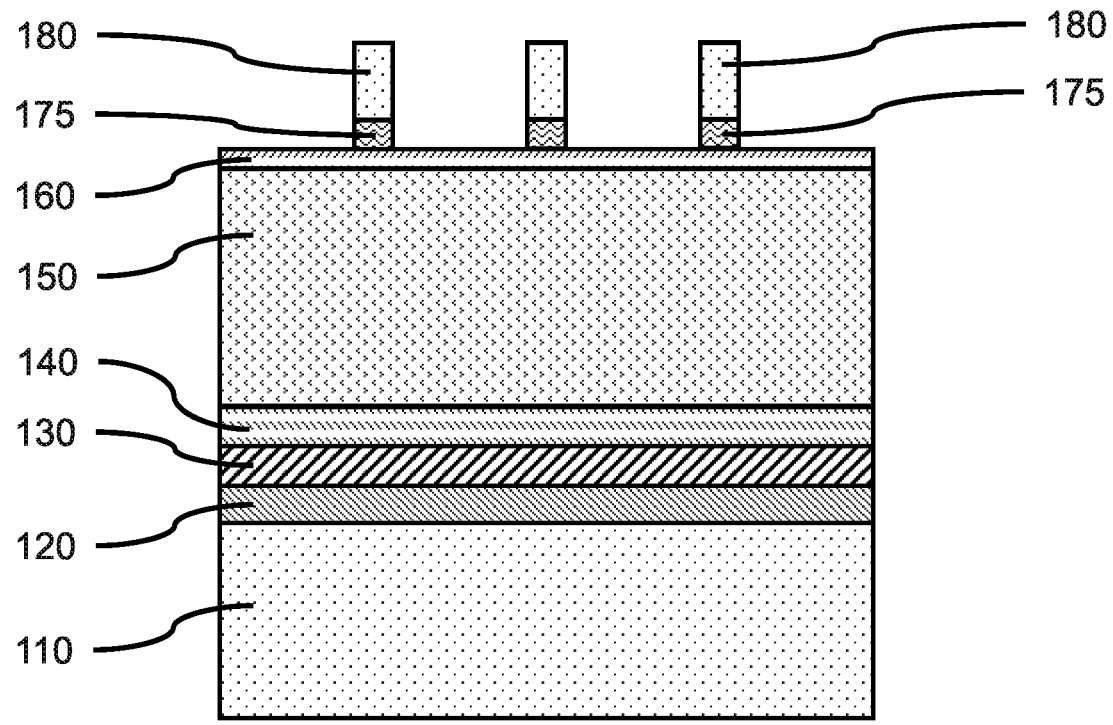
FIG. 2 is a cross-sectional view showing an exposed portion of an organic adhesion layer removed, in accordance with an embodiment of the present invention.

FIG. 2 is a cross-sectional view showing an exposed portion of an organic adhesion layer removed, in accordance with an embodiment of the present invention.

In one or more embodiments, the portions of the adhesion layer 170 exposed between the resist templates 180 can be removed to form an adhesion segment 175 below each of the resist templates. The portions of the adhesion layer 170 can be removed using a selective, directional etch, for example, a reactive ion etch (RIE) to expose the underlying upper hardmask layer 160.

Due to the organic nature of the resist layer and organic adhesion layer 170, the upper hardmask layer 160 can be contaminated and/or coated with an organic residue that can interfere or prevent the upper hardmask layer 160 from being etched using a chemical oxide removal (COR) process. Before the COR process can be utilized, the contamination can be removed.

Figure 3:
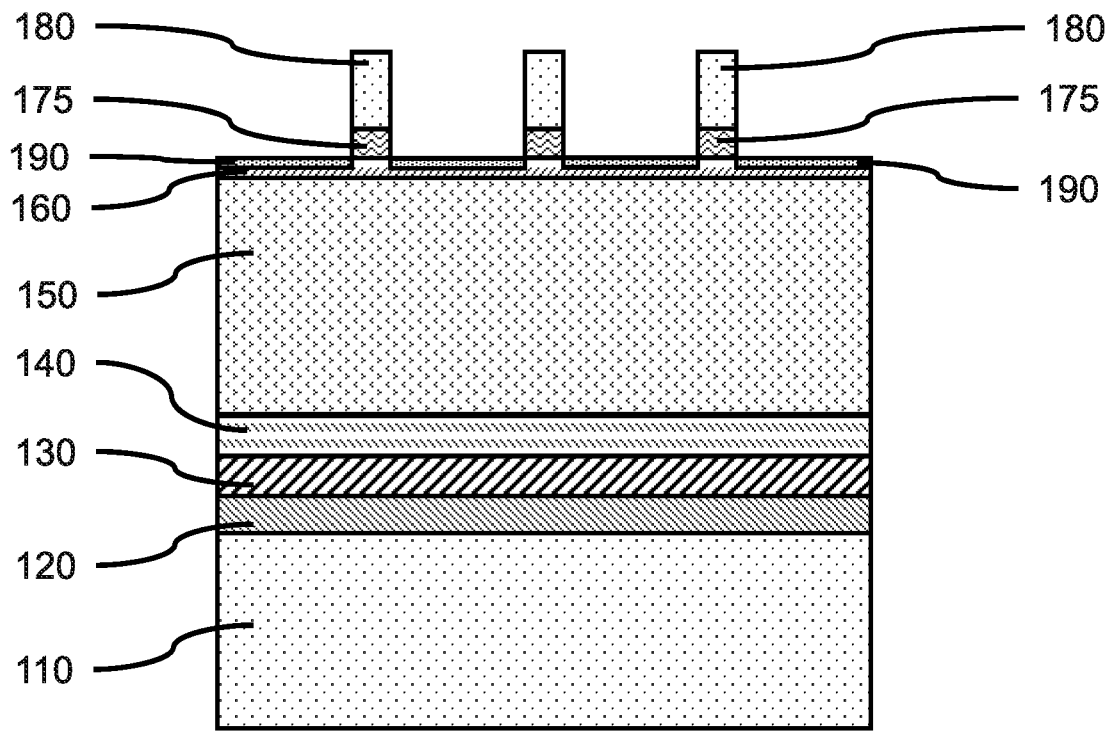
FIG. 3 is a cross-sectional view showing an activated and modified surface of an upper hardmask layer, in accordance with an embodiment of the present invention.

FIG. 3 is a cross-sectional view showing an activated and modified surface of an upper hardmask layer, in accordance with an embodiment of the present invention.

In one or more embodiments, the exposed surfaces of the upper hardmask layer 160 can be modified and activated using a dry (i.e., without $H_2O$) etch process, where the dry etch process can utilize oxygen ($O_2$) gas and Argon (Ar) gas, hydrogen bromide (HBr) gas and oxygen ($O_2$) gas, or a fluorocarbon based gas ($CH_xF_y$), for example, $CF_4$, $CHF_3$, to remove the contamination and activate the underlying upper hardmask layer surface. In various embodiments, the dry etch process is not a plasma process or plasma enhanced process.

Without intending to be bound by theory, it is believed that the oxygen ($O_2$) gas and hydrogen bromide (HBr) gas react with organic residue on the exposed surface to form volatile species that can be desorbed, and fluoride ions can be incorporated into the upper hardmask layer 160 from the $CH_xF_y$, where the fluoride incorporation can increase the etch rate of the upper hardmask for the COR process.

TABLE 1

| MEASUREMENT STAGE | Si % | O % | C % | N % | F % |
|---|---|---|---|---|---|
| POST HM LAYER DEPOSIT | 33 | 65 | 0.06 | 0.08 | 0.07 |
| AFTER RESIST DEVELOPMENT | 32 | 61 | 3 | 1.1 | 1.3 |
| AFTER DRY ETCH PROCESS MOD/ACT | 32 | 62 | 0.07 | 1.1 | 3.5 |

TABLE 1 shows the changes in the elemental composition measured at the surface of the upper hardmask layer 160 at different stages of the processing. After the dry gas etch process, the measurements show a decrease in the amount of carbon detected on the surface of the upper hardmask layer 160 and an increase in the amount of fluoride (F) detected. Where the table values of the surface elemental composition were obtained using x-ray photoelectron spectroscopy (XPS).

In various embodiments, the exposed surfaces of the upper hardmask layer 160 can be exposed to the dry gas phase etch process to produce modified and activated surfaces 190. The modified and activated surfaces 190 can have reduced carbon content and increased fluoride content compared to the as-deposited and/or post resist development upper hardmask layer 160, as shown in TABLE 1.

In various embodiments, the dry etch process can be conducted with a process gas flow of the oxygen ($O_2$) in a range of about 10 sccm to about 250 sccm, or about 20 sccm to about 200 sccm, although other gas flows are also contemplated, and a process gas flow of the argon gas (Ar) in a range of about 50 sccm to about 500 sccm, or about 100 sccm to about 300 sccm, although other gas flows are also contemplated. The dry etch process can be conducted at a total pressure in a range of about 5 mTorr to about 100 mTorr, or about 10 mTorr to about 50 mTorr.

In various embodiments, the $O_2$/Ar dry gas phase etch process can be conducted at a temperature in a range of about 5° C. to about 60° C., or about 20° C. to about 40° C.

In various embodiments, the dry etch process can be conducted with a process gas flow of the oxygen ($O_2$) in a range of about 10 sccm to about 200 sccm, or about 20 sccm to about 100 sccm, although other gas flows are also contemplated, and a process gas flow of the hydrogen bromide (HBr) in a range of about 25 sccm to about 250 sccm, or about 50 sccm to about 200 sccm, although other gas flows are also contemplated. The dry gas phase etch process can be conducted at a total pressure in a range of about 5 mTorr to about 100 mTorr, or about 10 mTorr to about 50 mTorr.

In various embodiments, the HBr/$O_2$ dry gas phase etch process can be conducted at a temperature in a range of about 5° C. to about 60° C., or about 20° C. to about 40° C.

In various embodiments, the dry etch process can be conducted with a flow of fluorinated carbon based gas ($CH_xF_y$) in a range of about 2 sccm to about 50 sccm. The CF-based gases include, but are not limited to tetrafluoromethane ($CF_4$), trifluoromethane ($CHF_3$), octafluorocyclobutane ($C_4F_8$), hexafluoro-2-butyne ($C_4F_6$), and combinations thereof.

Figure 4:
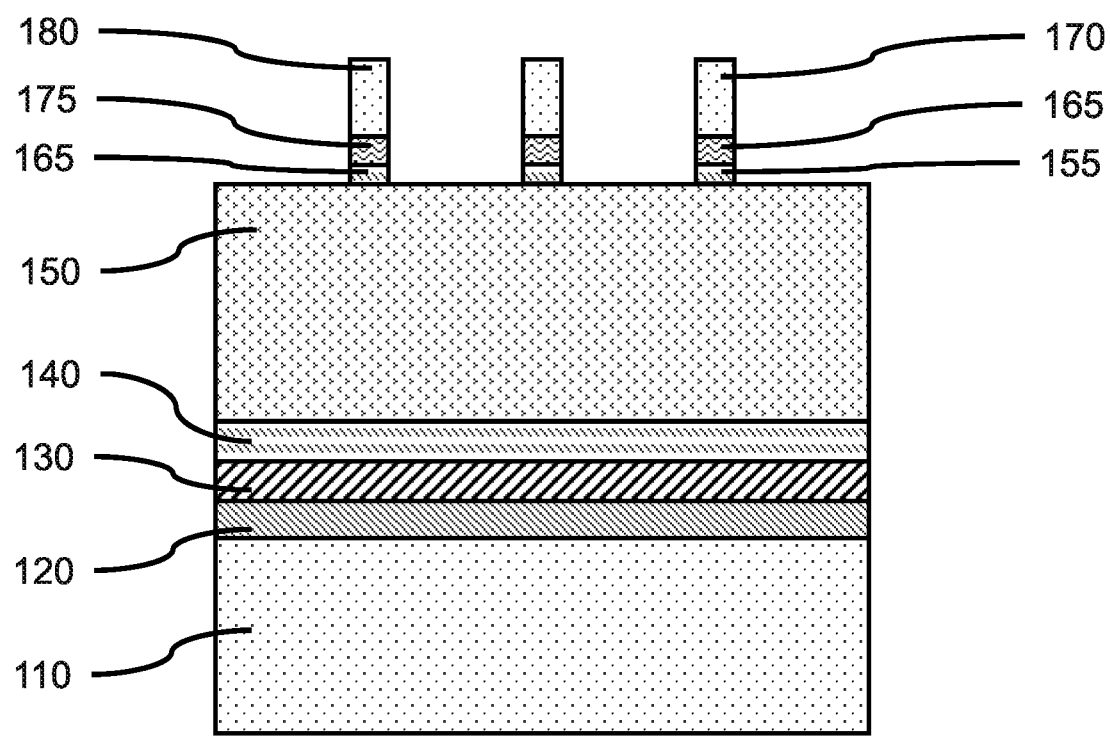
FIG. 4 is a cross-sectional view showing an exposed portion of the upper hardmask layer removed, in accordance with an embodiment of the present invention.

FIG. 4 is a cross-sectional view showing an exposed portion of the upper hardmask layer removed, in accordance with an embodiment of the present invention.

In one or more embodiments, the upper hardmask layer 160 with modified and activated surfaces 190 can be removed using a chemical oxide removal (COR) process, where the COR process can be used to removed non-thermal oxides (e.g., CVD oxide layers). The use of the dry etch process with the COR process can allow the use of thinner resist templates that used with a dry plasma etch (e.g., RIE).

The chemical oxide removal (COR) etch process can be conducted with a partial pressure of the ammonia ($NH_3$) in a range of about 10 Torr to about 100 Torr, or about 20 Torr to about 80 Torr, or about 30 Torr to about 50 Torr, although other partial pressures are also contemplated. The COR etch process can be conducted with a partial pressure of the hydrogen fluoride gas (HF) in a range of about 10 Torr to about 100 Torr, or about 20 Torr to about 80 Torr, or about 30 Torr to about 50 Torr, although other partial pressures are also contemplated. In various embodiments, the ratio of hydrogen fluoride (HF) to ammonia can be about 2:1.

In various embodiments, the COR process can be conducted at a temperature in a range of about 20° C. to about 100° C., or about 30° C. to about 50° C.

Figure 5:
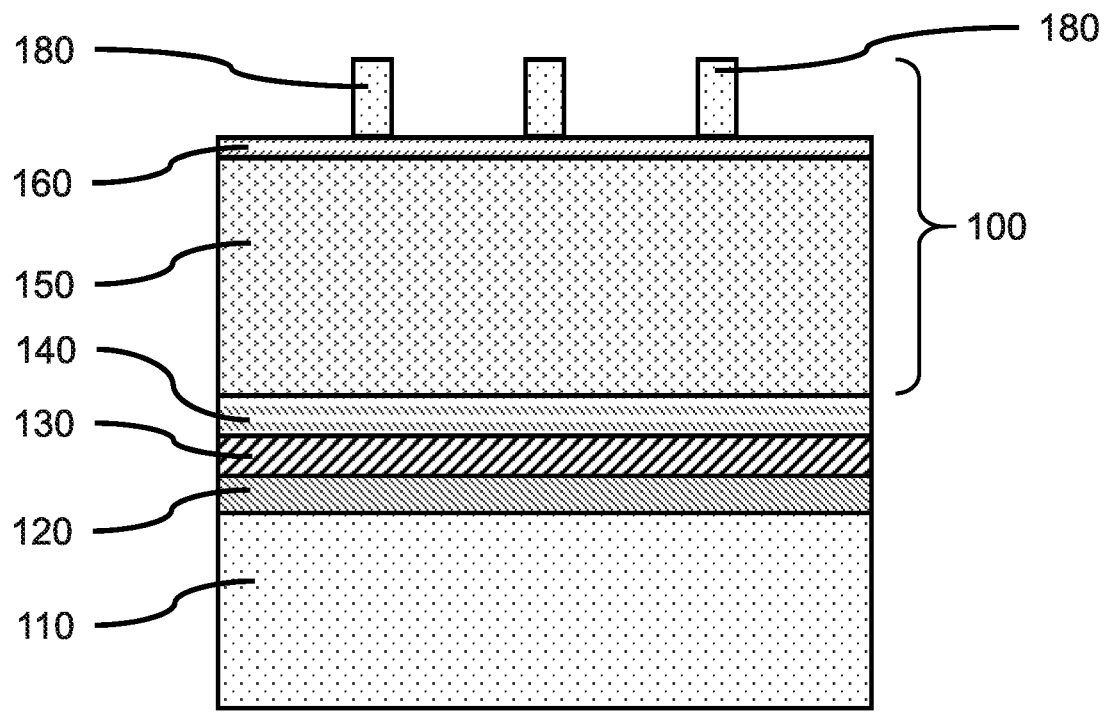
FIG. 5 is a cross-sectional view showing an extreme ultra violet (EUV) tri-layer patterning stack, in accordance with another embodiment of the present invention.

FIG. 5 is a cross-sectional view showing an extreme ultra violet (EUV) tri-layer patterning stack, in accordance with another embodiment of the present invention.

The extreme ultra violet (EUV) tri-layer patterning stack can include an organic planarization layer (OPL) 150 on a substrate 110, an upper hardmask layer 160 on the OPL 150, and a resist layer on the upper hardmask layer 160. The adhesion layer 170 can be excluded from the patterning stack 100, where the resist layer or resist templates 180 have sufficient attachment strength to the underlying upper hardmask layer, such that the additional adhesive is not needed. The resist layer can be patterned and developed to form one or more resist templates 180 on the adhesion layer 170.

In various embodiments, a mono-layer can be applied as an adhesion layer 170 between the hardmask 160 and the resist layer. The adhesion layer 170 can be one or two monolayers of hexamethyldisilazane (HMDS), where the HMDS promotes adhesion, but allows tighter pitches for the resist templates 180.

In various embodiments, the upper hardmask layer can be an amorphous silicon (a-Si)/silicon nitride (SiN) bilayer, rather than a silicon oxide (SiO) layer.

Figure 6:
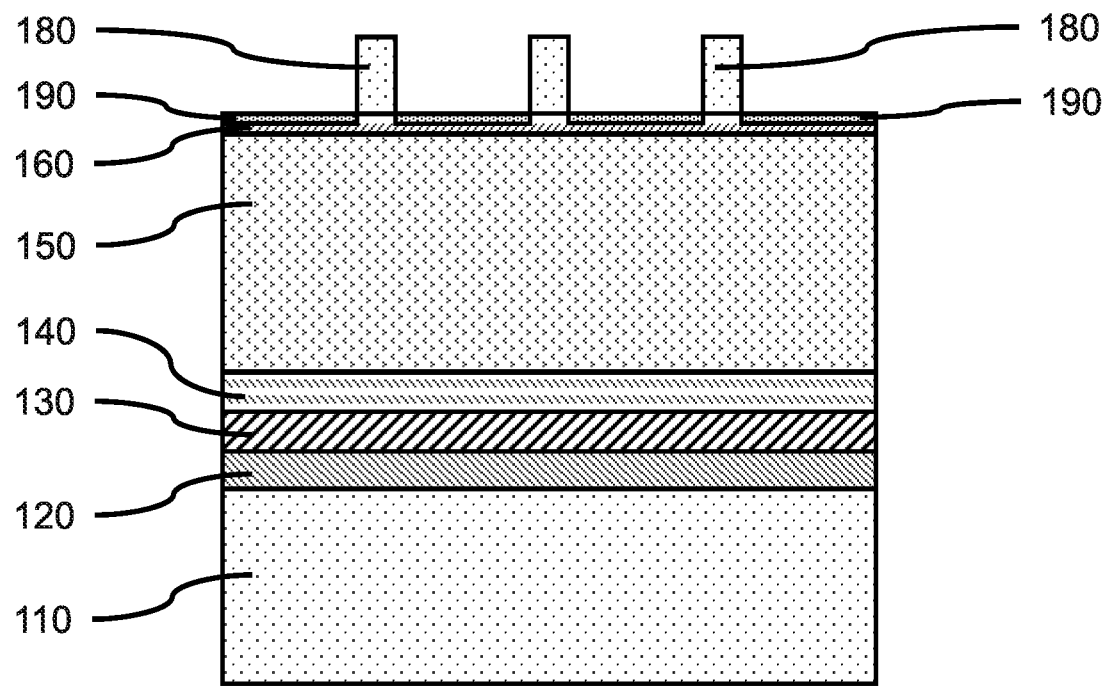
FIG. 6 is a cross-sectional view showing an activated and modified surface of an upper hardmask layer, in accordance with another embodiment of the present invention.

FIG. 6 is a cross-sectional view showing an activated and modified surface of an upper hardmask layer, in accordance with another embodiment of the present invention.

As described above, the exposed surfaces of the upper hardmask layer 160 can be modified and activated to allow the upper hardmask layer 160 to be removed using the dry gas phase etch process. The same gas flow, pressure, and temperature ranges can be used as for the oxide layer.

Figure 7:
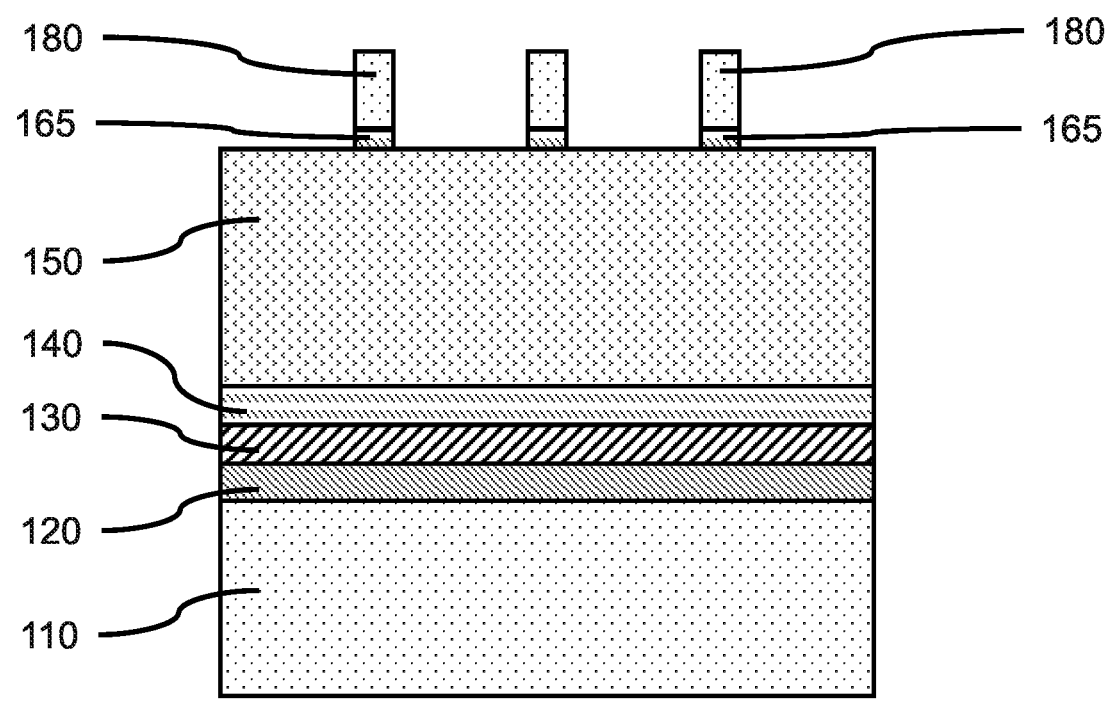
FIG. 7 is a cross-sectional view showing an exposed portion of the upper hardmask layer removed, in accordance with another embodiment of the present invention.

FIG. 7 is a cross-sectional view showing an exposed portion of the upper hardmask layer removed, in accordance with another embodiment of the present invention.

In one or more embodiments, a Frontier® (Applied Materials, Santa Clara, Calif.) etch process can be used to remove the SiCHO-type silicon anti-reflection coating (SiARC), silicon oxycarbide (SiOC)), silicon carbide (SiC), amourphous silicon (a-Si), silicon nitride (SiN), amorphous silicon (a-Si)/silicon nitride (SiN) bilayer, or combination thereof forming the exposed portions of the upper hardmask layer 160 to form an upper hardmask segment 165 below each of the resist templates 180. The use of the dry etch process with the Frontier® processes can allow the use of thinner resist templates that used with a dry plasma etch (e.g., RIE).

After opening the upper hardmask layer 160 to form the upper hardmask segment 165, selective directional etched (e.g., RIE) can be used to remove exposed portions of each of the underlying layers 150, 140, 130, 120, 110, to form new openings for deposited layers and devise features.

Figure 8:
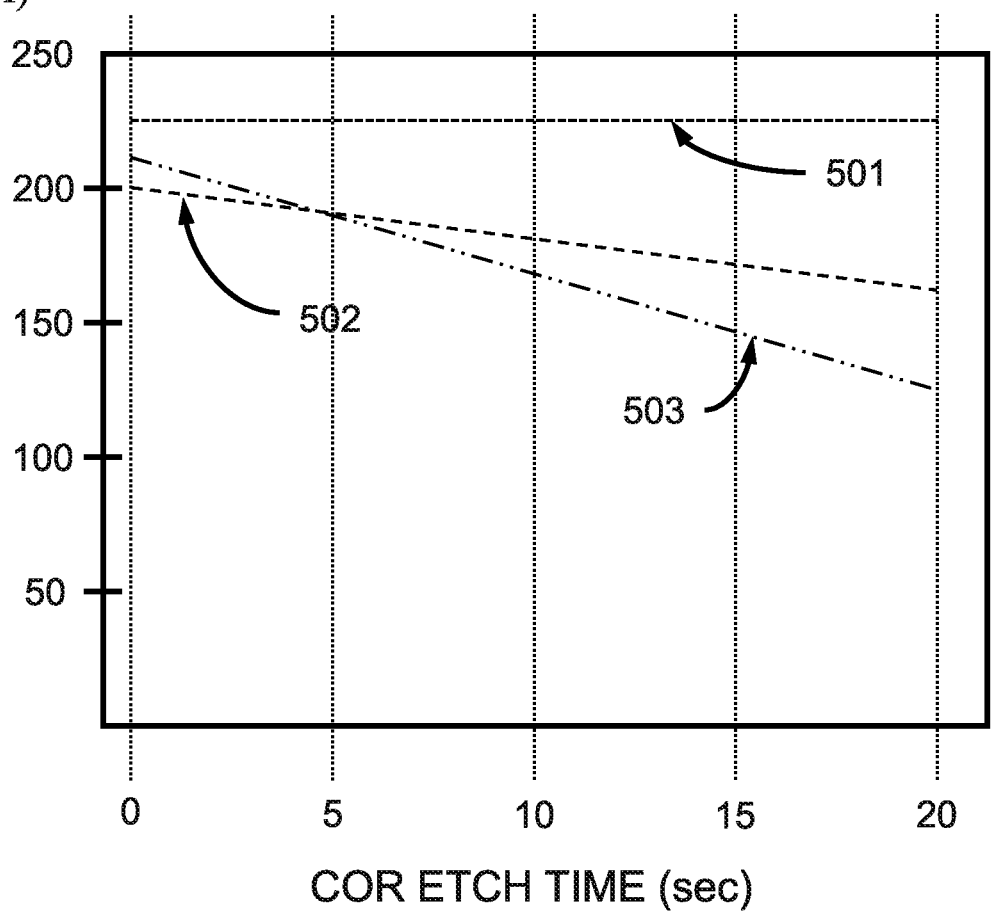
FIG. 8 is a graph showing a comparison of chemical oxide removal (COR) etch rates for a silicon dioxide layer with and without activation and modification of the oxide layer, in accordance with an embodiment of the present invention.

FIG. 8 is a graph showing a comparison of chemical oxide removal (COR) etch rates for a silicon dioxide layer with and without activation and modification of the oxide layer, in accordance with an embodiment of the present invention.

The graph shows that the post resist development upper hardmask layer shows essentially no susceptibility to the COR process for removing an oxide hardmask layer. The COR process has an essentially zero etch rate prior to the dry gas phase etch process (line 501), which can be due to organic contamination on the surface. The graph shows that a clean, as-deposited, upper hardmask layer shows some susceptibility to the COR process for removing an oxide hardmask layer. The COR process prior to the dry gas phase etch process has a marginal etch rate (line 502) greater than the post resist development upper hardmask layer (line 501). The graph shows that a modified and activated upper hardmask layer shows an increased susceptibility to the COR process for removing an oxide hardmask layer over the other processing situations. The COR process has the greatest etch rate (line 503) after the dry etch process, which is greater than the post resist development upper hardmask layer (line 501) and the clean, as-deposited, upper hardmask layer (line 502).

Figure 9:
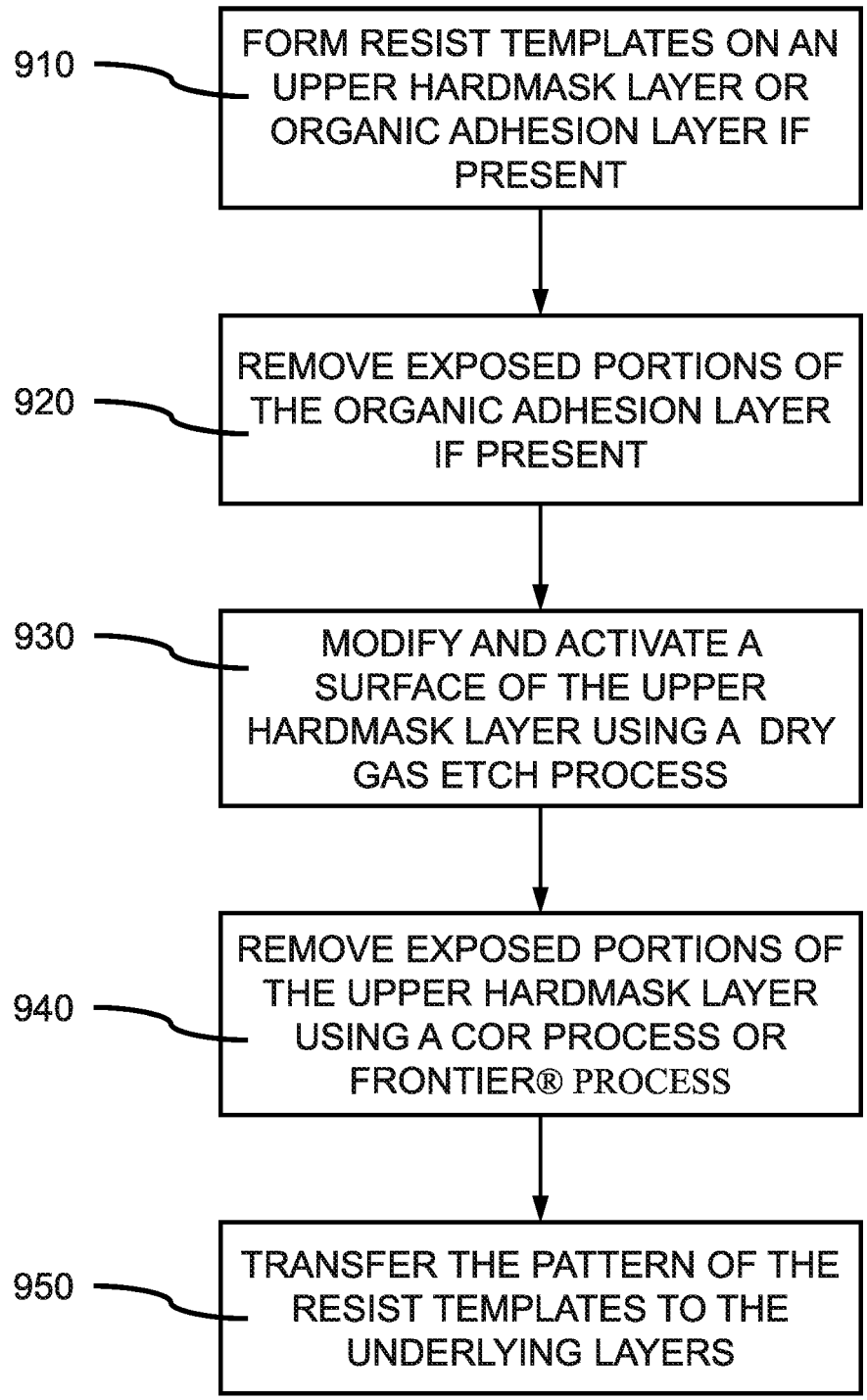
FIG. 9 is a block/flow diagram showing an etching process, in accordance with an embodiment of the present invention.

FIG. 9 is a block/flow diagram showing an etching process, in accordance with an embodiment of the present invention.

In block 910, a resist layer can be patterned to form one or more resist templates on an underlying organic adhesion layer or directly on a hardmask layer if the organic adhesion layer is not used. The organic adhesion layer can be one or two monolayers of hexamethyldisilazane (HMDS) to promote the adhesion of the one or more resist templates to the upper hardmask layer. The resist layer can be patterned using lithographic methods including EUV lithography.

The upper hardmask layer can be amorphous silicon (a-Si), a spin-on SiCHO-type silicon anti-reflection coating (SiARC), a silicon oxide (SiO) layer (e.g., silicon dioxide ($SiO_2$), silicon oxycarbide (SiOC)), a silicon nitride (SiN) layer (e.g., silicon nitride ($Si_3N_4$)), a silicon carbide layer (SiC), an amorphous silicon (a-Si)/silicon nitride (SiN) bilayer, or a combination thereof.

In block 920, the portions of the organic adhesion layer exposed between the resist templates can be removed to expose the underlying upper hardmask layer. The resist layer and organic adhesion layer can leave an organic residue on the surface of the upper hardmask layer, which could prevent or interfere with the COR or Frontier® etch process from removing the portions of the upper hardmask layer.

In block 930, the surface of the hardmask layer can be modified and activated by a dry etch process that does not change the thickness of the hardmask layer or effect the resist templates. The dry etch process can cause carbon removal and fluorine incorporation that enables isotropic (e.g., uniform) hardmask removal.

In block 940, the exposed portions of the hardmask layer can be removed using the COR process or Frontier® etch process without causing line breaks in the resist templates.

In block 950, the pattern of the resist templates formed in the upper hardmask layer can be transferred to the underlying layers using material-selective etching processes, for example, reactive ion etching (RIE). The pattern can be transferred through the intervening layers down to the substrate for fabrication additional device features. The overlying layers can also be removed using selective etching after the pattern has been transferred.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of removing layers of an extreme ultraviolet (EUV) patterned stack, comprising:
    forming one or more resist templates on an upper hardmask layer using an extreme ultraviolet (EUV) exposure;
    exposing portions of the surface of the upper hardmask layer to a dry etch process to produce a modified surface with a reduced carbon content, wherein the dry etch process is not a plasma process or a plasma enhanced process;
    exposing the portions of the surface of the upper hardmask layer with reduced carbon content to one or more fluorinated hydrocarbon gasses to form an activated surface having an increased fluoride content, as compared to a post resist development upper hardmask layer surface; and
    etching the modified and activated surfaces of the upper hardmask layer using an etchant different from the dry etch process to expose an underlying organic planarization layer, wherein the modified and activated surfaces of the upper hardmask layer have an increased etch rate compared to an etch rate of the upper hardmask layer without the dry etch process and increased fluoride content.

2. The method of claim 1, wherein each of the one or more resist templates has a thickness in a range of about 4 nm to about 40 nm.

3. The method of claim 2, wherein an adhesion layer is between the one or more resist templates and the upper hardmask layer.

4. The method of claim 2, wherein the upper hardmask layer is an inorganic material layer selected from the group consisting of amorphous silicon (a-Si), spin-on SiCHO-type silicon anti-reflection coating (SiARC), silicon oxide (SiO), silicon oxycarbide (SiOC), silicon nitride (SiN), silicon carbide (SiC), amorphous silicon (a-Si)/silicon nitride (SiN) bilayer, and combinations thereof.

5. The method of claim 4, wherein the upper hardmask layer is silicon dioxide ($SiO_2$).

6. The method of claim 5, wherein etching the modified and activated surfaces utilizes a chemical oxide removal (COR) process.

7. The method of claim 2, wherein the upper hardmask layer is selected from the group of materials consisting of amorphous silicon (a-Si), silicon nitride (SiN), silicon oxycarbide (SiOC), and silicon carbide (SiC).

8. The method of claim 7, wherein the dry etch process to form the modified and activated surfaces utilizes process gasses selected from the group consisting of oxygen ($O_2$) and argon (Ar) or oxygen ($O_2$) and hydrogen bromide (HBr), in combination with one or more fluorinated hydrocarbons selected from the group consisting of tetrafluoromethane ($CF_4$), trifluoromethane ($CHF_3$), octafluorocyclobutane ($C_4F_8$), and hexafluoro-2-butyne ($C_4F_6$).

9. The method of claim 8, further comprising removing exposed portions of the organic planarization layer using a reactive ion etch (RIE).

10. A method of removing layers of an extreme ultraviolet (EUV) patterned stack, comprising:
    forming one or more resist templates using an EUV exposure on an adhesion layer, wherein each of the one or more resist templates has a height in a range of about 5 nm to about 20 nm;
    removing exposed portions of the adhesion layer to expose an upper hardmask layer;
    exposing portions of the surface of the upper hardmask layer to a dry etch process to produce a modified surface with a reduced carbon content, wherein the dry etch process is not a plasma process or a plasma enhanced process;
    exposing the portions of surface of the upper hardmask layer with reduced carbon content to one or more fluorinated hydrocarbon gasses to form an activated surface having an increased fluoride content, as compared to a post resist development upper hardmask layer surface; and
    etching the modified and activated surfaces of the upper hardmask layer using a chemical oxide removal (COR) process to expose an underlying organic planarization layer, wherein the modified and activated surfaces of the upper hardmask layer have an increased etch rate using the chemical oxide removal process compared to an etch rate of the upper hardmask layer without the dry etch process and increased fluoride content.

11. The method of claim 10, wherein each of the one or more resist templates has a thickness in a range of about 5 nm to about 18 nm.

12. The method of claim 11, wherein upper hardmask layer is silicon dioxide ($SiO_2$).

13. The method of claim 12, wherein the dry etch process utilizes oxygen ($O_2$) gas and hydrogen bromide (HBr) gas or oxygen ($O_2$) gas and argon (Ar) gas, and the one or more fluorinated hydrocarbon gasses are selected from the group consisting of tetrafluoromethane ($CF_4$), trifluoromethane ($CHF_3$), octafluorocyclobutane ($C_4F_8$), hexafluoro-2-butyne ($C_4F_6$), and combinations thereof.

14. The method of claim 13, wherein the dry gas phase etch process is conducted at a temperature in a range of about 30° C. to about 50° C.

15. The method of claim 13, wherein the dry etch process utilizes oxygen ($O_2$) gas at a process flow in a range of 10 sccm to about 200 sccm, and hydrogen bromide (HBr) gas at a flow of about 25 sccm to about 250 sccm.

* * * * *